(12) United States Patent
Huang

(10) Patent No.: US 12,315,808 B2
(45) Date of Patent: May 27, 2025

(54) SEMICONDUCTOR DEVICE WITH LINER STRUCTURE

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 487 days.

(21) Appl. No.: 17/723,751

(22) Filed: Apr. 19, 2022

(65) Prior Publication Data

US 2023/0335495 A1 Oct. 19, 2023

(51) Int. Cl.
*H01L 23/532* (2006.01)
*H01L 21/768* (2006.01)
*H01L 23/522* (2006.01)
*H01L 23/528* (2006.01)

(52) U.S. Cl.
CPC .... *H01L 23/53238* (2013.01); *H01L 23/5226* (2013.01); *H01L 23/5283* (2013.01); *H01L 23/53266* (2013.01); *H01L 21/76831* (2013.01); *H01L 21/76832* (2013.01); *H01L 21/76843* (2013.01)

(58) Field of Classification Search
CPC ........... H01L 23/53238; H01L 23/5226; H01L 23/53295; H01L 21/76834; H01L 21/76843; H01L 21/76831; H01L 21/76832; H01L 21/76849; H01L 21/76807; H01L 21/76829
See application file for complete search history.

(56) References Cited

U.S. PATENT DOCUMENTS

| | | | | |
|---|---|---|---|---|
| 6,319,783 | B1 * | 11/2001 | Ang | H01L 29/6653 257/E29.267 |
| 6,528,426 | B1 * | 3/2003 | Olsen | H01L 21/3212 438/689 |
| 6,645,853 | B1 * | 11/2003 | Ngo | H01L 23/53238 257/E23.145 |
| 2002/0155695 | A1 * | 10/2002 | Lee | H01L 21/76835 257/E21.279 |
| 2004/0092095 | A1 | 5/2004 | Nguyen et al. | |

(Continued)

FOREIGN PATENT DOCUMENTS

| TW | 506105 B | 10/2002 |
|---|---|---|
| TW | I612666 B | 1/2018 |

(Continued)

OTHER PUBLICATIONS

Office Action mailed on Oct. 18, 2022 related to Taiwanese Application No. 111122240.

(Continued)

*Primary Examiner* — Zandra V Smith
*Assistant Examiner* — John M Parker
(74) *Attorney, Agent, or Firm* — Xuan Zhang

(57) ABSTRACT

The present application discloses a semiconductor device. The semiconductor device includes a substrate; a first dielectric layer positioned on the substrate; a first conductive layer positioned in the first dielectric layer; an intervening film positioned on the first conductive layer and including a U-shaped cross-sectional profile; and a filler layer positioned on the intervening film. The intervening film includes silicon carbide.

15 Claims, 18 Drawing Sheets

(56) References Cited

U.S. PATENT DOCUMENTS

| | | | |
|---|---|---|---|
| 2004/0142561 A1* | 7/2004 | Wu | H01L 21/76885 |
| | | | 257/E21.589 |
| 2004/0147104 A1* | 7/2004 | Lin | H01L 21/76877 |
| | | | 257/E21.585 |
| 2008/0150138 A1 | 6/2008 | Bright et al. | |
| 2012/0118619 A1* | 5/2012 | Booth, Jr. | H01L 21/31116 |
| | | | 438/653 |
| 2015/0108649 A1* | 4/2015 | Kuo | H01L 23/53252 |
| | | | 438/643 |
| 2019/0088542 A1 | 3/2019 | Hsieh et al. | |
| 2019/0355618 A1* | 11/2019 | Lin | H01L 21/7684 |
| 2020/0388686 A1 | 12/2020 | Eom et al. | |
| 2021/0118874 A1* | 4/2021 | Huang | H01L 29/66621 |
| 2021/0398879 A1* | 12/2021 | Huang | H01L 21/76802 |
| 2022/0393105 A1 | 12/2022 | Leng | |

FOREIGN PATENT DOCUMENTS

| | | |
|---|---|---|
| TW | 202013518 A | 4/2020 |
| TW | 202201535 A | 1/2022 |

OTHER PUBLICATIONS

Office Action mailed on Apr. 28, 2023 related to Taiwanese Application No. 111122237.
Office Action and and the search report mailed on Jan. 13, 2025 related to U.S. Appl. No. 17/724,158.

\* cited by examiner

SEMICONDUCTOR DEVICE WITH LINER STRUCTURE

TECHNICAL FIELD

The present disclosure relates to a semiconductor device, and more particularly, to a semiconductor device with a liner structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a first dielectric layer positioned on the substrate; a first conductive layer positioned in the first dielectric layer; an intervening film positioned on the first conductive layer and including a U-shaped cross-sectional profile; and a filler layer positioned on the intervening film. The intervening film includes silicon carbide.

Another aspect of the present disclosure provides a semiconductor device including a substrate; an impurity region positioned in the substrate; an intervening film positioned on the impurity region and including a U-shaped cross-sectional profile; and a filler layer positioned on the intervening film. The intervening film includes silicon carbide.

Another aspect of the present disclosure provides a method for fabricating a semiconductor device including providing a substrate; forming a first dielectric layer on the substrate; forming a first conductive layer in the first dielectric layer; forming a second dielectric layer on the first dielectric layer; forming an opening along the second dielectric layer to expose the first conductive layer; conformally forming a layer of first material in the opening; forming a layer of filler material on the layer of first material to completely fill the opening; performing a planarization process until the top surface of the second dielectric layer is exposed to turn the layer of first material into an intervening film and the layer of filler material into a filler layer. The intervening film includes a U-shaped cross-sectional profile and silicon carbide.

Another aspect of the present disclosure provides a method for fabricating a semiconductor device including providing a substrate; forming an impurity region in the substrate; forming a first dielectric layer on the substrate; forming an opening along the first dielectric layer to expose the impurity region; conformally forming a layer of first material in the opening; forming a layer of filler material on the layer of first material to completely fill the opening; performing a planarization process until the top surface of the first dielectric layer is exposed to turn the layer of first material into an intervening film and the layer of filler material into a filler layer. The intervening film includes a U-shaped cross-sectional profile and silicon carbide.

Due to the design of the semiconductor device of the present disclosure, the electron migration may be reduced or avoided by employing the intervening film formed of silicon carbide. As a result, the yield and/or reliability of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
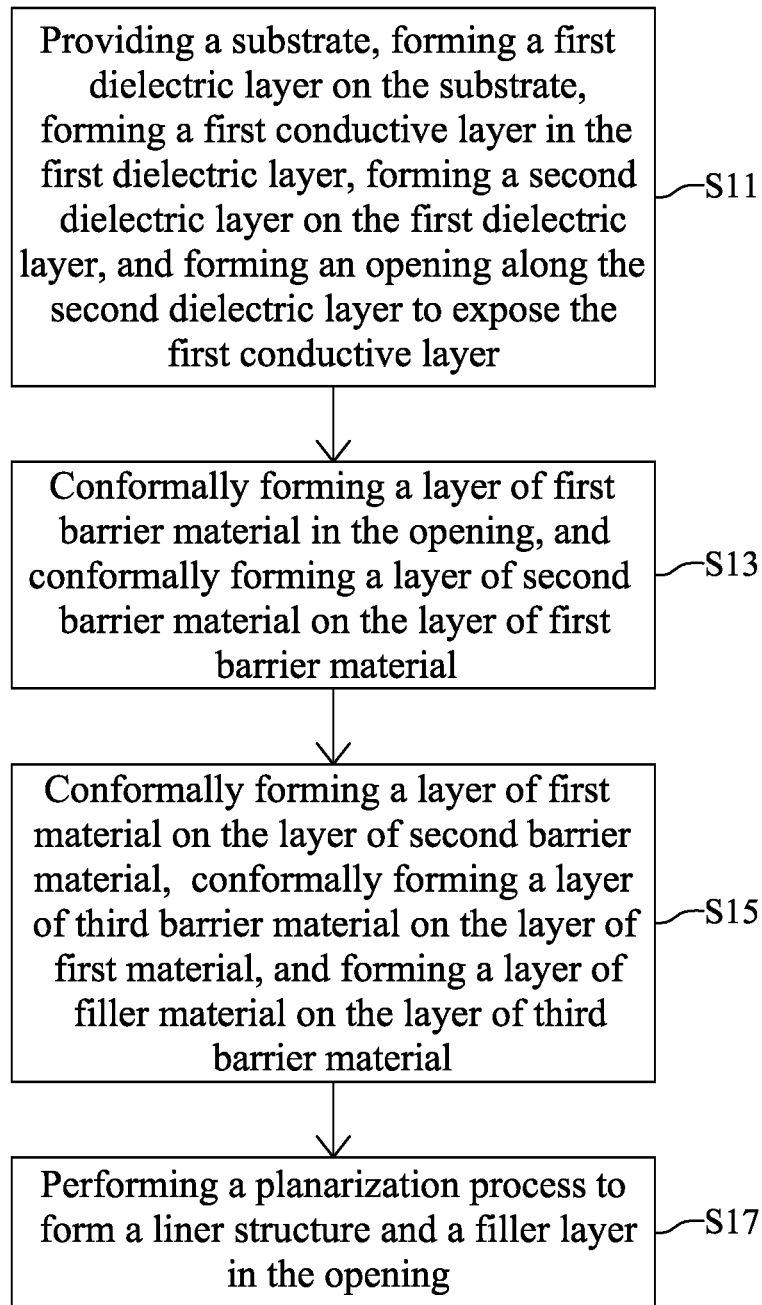
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the term "film" refers to a layer continuously extending in a direction perpendicular to a thickness direction substantially without pinholes to cover an entire target or concerned surface, or simply a layer covering a target or concerned surface. The term "layer" refers to a structure having a certain thickness formed on a surface or a synonym of film or a non-film structure. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor device 1A in accordance with one embodiment of the present disclosure. FIGS. 2 to 6 illustrate, in schematic cross-sectional view diagrams, part of a flow for fabricating the semiconductor device 1A in accordance with one embodiment of the present disclosure.

With reference to FIGS. 1 to 4, at step S11, a substrate 101 may be provided, a first dielectric layer 103 may be formed on the substrate 101, a first conductive layer 107 may be formed in the first dielectric layer 103, a second dielectric layer 105 may be formed on the first dielectric layer 103, and an opening OP may be formed along the second dielectric layer 105 to expose the first conductive layer 107.

Figure 2:
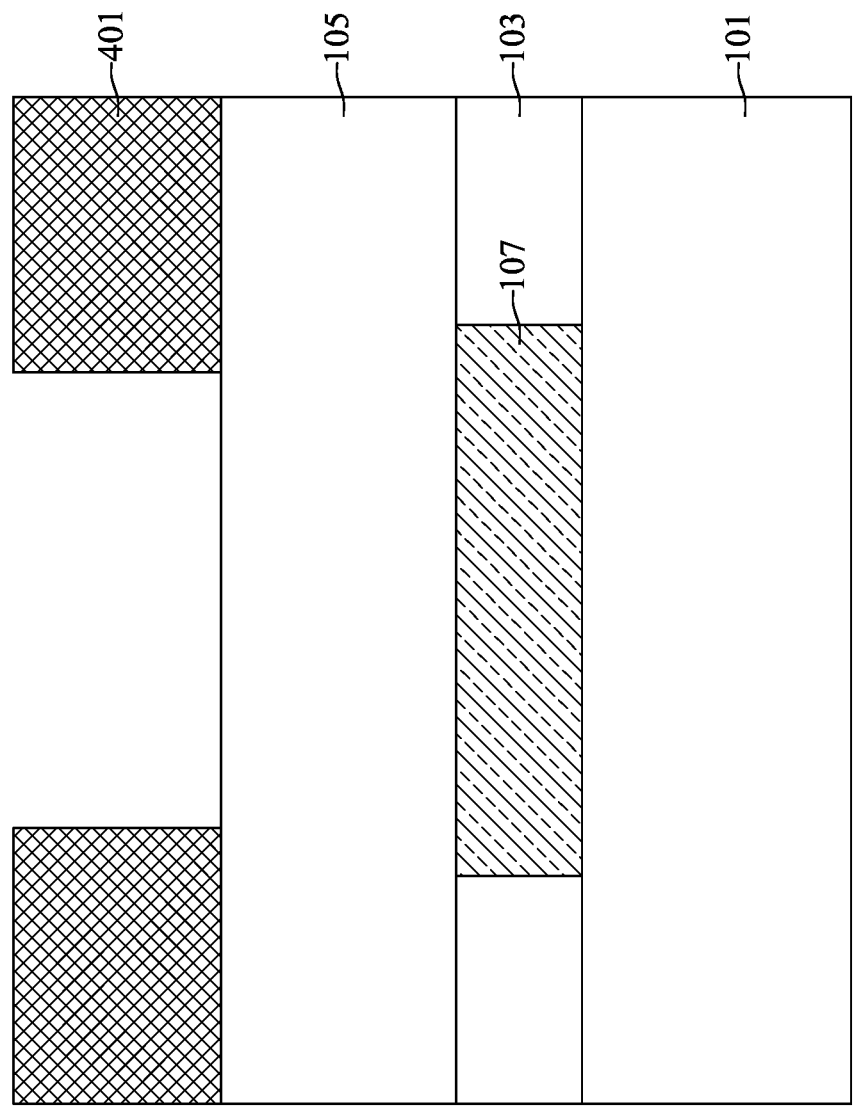
FIGS. 2 to 6 illustrate, in schematic cross-sectional view diagrams, part of a flow for fabricating the semiconductor device in accordance with one embodiment of the present disclosure.

With reference to FIG. 2, the substrate 101 may include a bulk semiconductor substrate that is composed entirely of at least one semiconductor material, a plurality of device elements (not show for clarity), a plurality of dielectric layers (not shown for clarity), and a plurality of conductive features (not show for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 2, the plurality of device elements may be formed on the bulk semiconductor substrate or the topmost semiconductor material layer. Some portions of the plurality of device elements may be formed in the bulk semiconductor substrate or the topmost semiconductor material layer. The plurality of device elements may be transistors such as complementary metal-oxide-semiconductor transistors, metal-oxide-semiconductor field-effect transistors, fin field-effect-transistors, the like, or a combination thereof.

With reference to FIG. 2, the plurality of dielectric layers may be formed on the bulk semiconductor substrate or the topmost semiconductor material layer and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps. In some embodiments, the first dielectric layer 103 and the second dielectric layer 105 may be part of the plurality of dielectric layers.

With reference to FIG. 2, the plurality of conductive features may include interconnect layers and conductive vias. The interconnect layers may be separated from each other and may be horizontally disposed in the plurality of dielectric layers along the direction Z. The conductive vias may connect adjacent interconnect layers along the direction Z, and adjacent device element and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

In some embodiments, the plurality of device elements and the plurality of conductive features may together configure functional units in the substrate 101. A functional unit, in the description of the present disclosure, generally refers to functionally related circuitry that has been partitioned for functional purposes into a distinct unit. In some embodiments, functional units may be typically highly complex circuits such as processor cores, memory controllers, or accelerator units. In some other embodiments, the complexity and functionality of a functional unit may be more or less complex.

With reference to FIG. 2, the first dielectric layer 103 may be formed on the substrate 101 and may be formed of, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the first dielectric layer 103 may include a self-planarizing material such as a spin-on glass or a spin-on low-k dielectric material such as SiLK™. The use of a self-planarizing dielectric material may avoid the need to perform a subsequent planarizing step. In some embodiments, the first dielectric layer 103 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps.

With reference to FIG. 2, the first conductive layer 107 may be formed along the second dielectric layer 105 and may be electrically coupled to the device element of the substrate 101 through corresponding conductive features of the substrate 101. In some embodiments, the first conductive layer 107 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The first conductive layer 107 may be formed by, for example, a damascene process.

With reference to FIG. 2, the second dielectric layer 105 may be formed on the first dielectric layer 103. The structure and the material of the second dielectric layer 105 may be similar to the first dielectric layer 103, and descriptions thereof are not repeated herein.

With reference to FIG. 2, a first mask layer 401 may be formed on the second dielectric layer 105. The first mask layer 401 may be a photoresist layer and may include the pattern of the opening OP.

Figure 3:
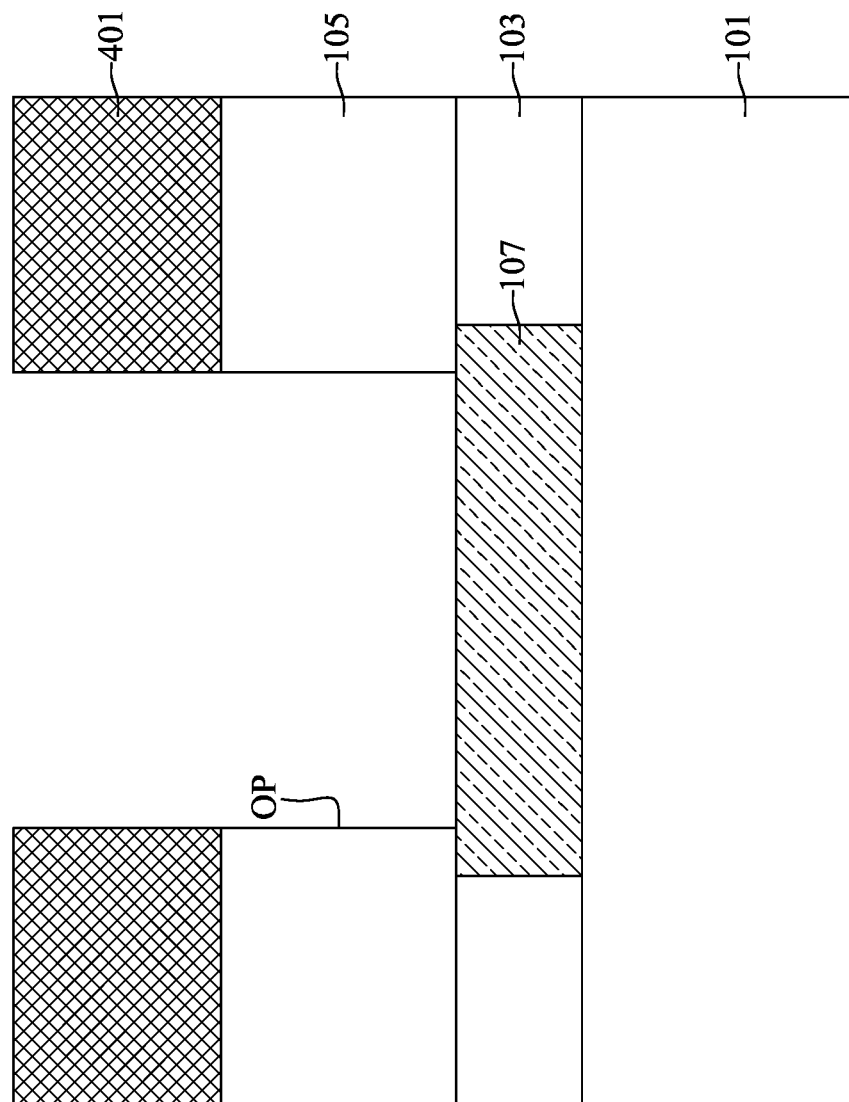

With reference to FIG. 3, an etching process may be performed using the first mask layer 401 as the mask to remove portions of the second dielectric layer 105. In some embodiments, the etch rate ratio of the second dielectric layer 105 to the first mask layer 401 may be between about 100:1 and about 1.05:1 or between about 100:1 and about 10:1 during the etching process. The etch rate ratio of the second dielectric layer 105 to the first conductive layer 107 may be between about 100:1 and about 1.05:1 or between about 100:1 and about 10:1 during the etching process. After the etching process, the opening OP may be formed along the second dielectric layer 105 to expose the first conductive layer 107.

Figure 4:
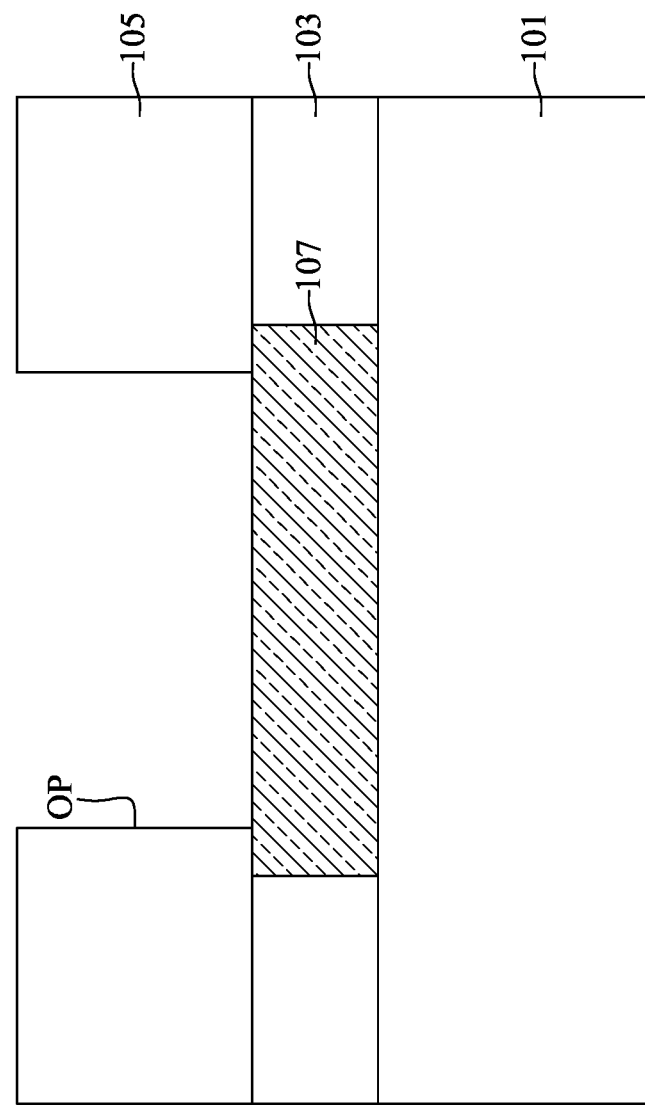

With reference to FIG. 4, after formation of the opening OP, the first mask layer 401 may be removed by, for example, an ashing process. It should be noted that some etching residues (not shown for clarity) may be left after the etching process and/or after the ashing process. The etching residue may be the remaining substances on the inner surface of the opening OP after the etching process or after the ashing process of the first mask layer 401. The etching residues may have different constitutions depending on the material to be etched or ashed. The etching residues may have adverse effects to the yield and/or reliability of the resulting semiconductor device 1A. A cleaning process may be performed to remove such etching residues. However, conventional cleaning process employing diluted hydrogen fluoride may cause undercut of the first conductive layer 107 which may result in electron migration during the following deposition for the opening OP. As a result, the yield and/or reliability of the resulting semiconductor device 1A may be impacted.

In some embodiments, a pre-cleaning treatment may be performed before the cleaning process to reduce adverse effects (e.g., undercut of the first conductive layer 107) of the cleaning process.

treatment, the intermediate semiconductor device illustrated in FIG. 4 may be spun at a rate between about 10 rpm and about 2000 rpm or between about 100 rpm and 1000 rpm. A pre-cleaning solution may be sprayed onto the intermediate semiconductor device to cover the entire front side of the intermediate semiconductor device. Simultaneously to applying the pre-cleaning solution onto the front side of the intermediate semiconductor device, water or other suitable solution may be applied to the backside of the intermediate semiconductor device to clean the backside of the intermediate semiconductor device.

In some embodiments, the pre-cleaning solution may include chelating agent(s), corrosion inhibitor(s), amine fluoride, surfactant(s), or solvent. In some embodiments, the amine fluoride and the surfactant(s) may be optional.

Generally, the chelating agent(s) may be also known as complexing or sequestering agent(s). The chelating agent(s) may have negatively charged ions called ligands that bind with free metal ions and form a combined complex that remain soluble. The chelating agent(s) may be used to remove metallic ions from the intermediate semiconductor device. It is not bound to any particular theory, the chelating agent(s) may also reduce or avoid the underlying first conductive layer 107 exposed through the opening OP being corroded.

In some embodiments, the chelating agent(s) of the pre-cleaning solution may include ethylenediaminetetraacetic acid, polyacrylates, carbonates, phosphonates, gluconates, N,N'-bis(2-hydroxyphenyl)ethylenediiminodiacetic acid, triethylenetetranitrilohexaacetic acid, desferriferrioxamin B, N,N',N"-tris[2-(N-hydroxycarbonyl)ethyl]-1,3,5-benzenetricarboxamide, and/or ethylenediaminediorthohydroxyphenylacetic acid. In some embodiments, the concentration of the chelating agent(s) may be between about 0.001 mg/L and about 300 mg/L or between about 0.01 mg/L and about 3 mg/L. In some embodiments, alternatively, the concentration of the chelating agent(s) may be between 1 ppm and about 400 ppm of the pre-cleaning solution or preferably about 40 ppm of the pre-cleaning solution.

The corrosion inhibitor(s) of the pre-cleaning solution may be provided to reduce or avoid the metal corrosion during the following cleaning process. In some embodiments, the corrosion inhibitor(s) may include an aliphatic alcohol compound having at least one mercapto group in the molecule. The number of carbon atoms constituting said alcohol compound is not less than 2, and a carbon atom bonded with a mercato group, and another carbon atom bonded with a hydroxyl group are contiguously bonded with each other. For example, the corrosion inhibitor(s) may be 2-mercaptoethanol and/or thioglycerol. In some embodiments, the concentration of the corrosion inhibitor(s) in the pre-cleaning solution may be between about 0.0001% and about 10% by weight or between about 0.001% and about 1% by weight. When the concentration is too low, the corrosion inhibiting effect may be limited to an unsatisfactory degree. Whereas too high concentration may not always give a further increased corrosion inhibiting effect and moreover may make it difficult to handle it due to the odor peculiar to mercapto group-carrying compounds.

Alternatively, in some embodiments, the corrosion inhibitor(s) of the pre-cleaning solution may include aromatic hydrocarbon compounds such as benzotriazole and/or 5-methylbenzimidazole. Alternatively, in some embodiments, the corrosion inhibitor(s) of the pre-cleaning solution may include uric acid, adenine, caffeine, and/or purine.

Alternatively, in some embodiments, the corrosion inhibitor(s) of the pre-cleaning solution may include glyoxylic. Due to the presence of glyoxylic acid, which is a reducing material, even if a metal material is exposed during the pre-cleaning treatment, by controlling the redox potential of the pre-cleaning solution by adjusting the concentration of glyoxylic acid therein, electron transfer between the pre-cleaning solution and the exposed metal material is controlled, and corrosion of the metal material is prevented.

Alternatively, in some embodiments, the corrosion inhibitor(s) of the pre-cleaning solution may include 2-mercaptoethanol, thioglycerol, benzotriazole, 5-methylbenzimidazole, uric acid, adenine, caffeine, purine, and/or glyoxylic acid.

In some embodiments, the amine fluoride of the pre-cleaning solution may include methylamine hydrofluoride, ethylamine hydrofluoride, propylamine hydrofluoride, tetramethylammonium fluoride, tetraethylammonium fluoride, ethanolamine hydrofluoride, methylethanolamine hydrofluoride, dimethylethanolamine hydrofluoride, and/or triethylenediamine hydrofluoride. The amine fluoride may be used to remove the etching residues.

In some embodiments, the concentration of the amine fluoride in the pre-cleaning solution may be determined according to the composition of the etching residues. For example, the concentration of the amine fluoride may be between about 0.1 mass % and about 5 mass % of the entire composition of the pre-cleaning solution, or between about 0.2 mass % and about 3 mass % of the entire composition of the pre-cleaning solution. By setting the concentration of the amine fluoride in such a range, it is possible to ensure that the amine fluoride in the pre-cleaning solution is capable of removing the etching residues, while preventing the amine fluoride from corroding underlying metal material exposed through the opening OP and suppressing etching of underlying dielectric layer exposed through the opening OP. That is, if the concentration of the amine fluoride in the pre-cleaning solution is too low, the ability to remove a residue is low, and if the concentration is too high, the metal material may be corroded, and the exposed dielectric layer may be etched or undergo structural change.

The purpose of the surfactant(s) may be to prevent reattachment or redeposition of particles on the intermediate semiconductor device after they have been dislodged from the intermediate semiconductor device. Preventing the reattachment of the particles is important because allowing the particles to reattach increases overall process time. The purpose of the surfactant(s) may also include imparting affinity toward a water-repellent material layer. Generally, surfactant(s) are long hydrocarbon chains that typically contain a hydrophilic (polar water-soluble group) and a hydrophobic group (a non-polar water-insoluble group). The surfactant(s) attach with their non-polar group to particles as well as to the front side of the intermediate semiconductor device. As a result, the polar group of the surfactant(s) will point away from the wafer and away from the particles towards the pre-cleaning solution covering the front side of the intermediate semiconductor device. Because of this the particles in the solution that are bound by the surfactant will be repelled electrostatically from the front side of the intermediate semiconductor device due to the polar groups of the surfactant(s) on both the particles and the front side of the intermediate semiconductor device.

In some embodiments, the surfactant(s) of the pre-cleaning solution may include non-ionic, anionic, or a mixture of non-ionic and anionic compounds. Non-ionic means that the polar end of the surfactant has an electrostatic rather than an ionic charge and anionic means that the polar end of the surfactant has a negative ionic charge. The nonionic surfactant may be, for example, polyoxyethylene butylphenyl ether and the anionic surfactant may be, for example, polyoxyethylene alkylphenyl sulfate. In some embodiments, the concentration of the surfactant(s) of the pre-cleaning solution may be between about 1 ppm and about 100 ppm. In some embodiments, the concentration of the non-ionic surfactant(s) in the pre-cleaning solution may be about 30 ppm and the concentration of the anionic surfactant(s) in the pre-cleaning solution may be about 30 ppm. In some embodiments, the concentration of the surfactant(s) of the pre-cleaning solution may be between 0.0001 mass % and 10 mass % of the entire composition of the pre-cleaning solution, or between about 0.001 mass % and about 5 mass % of the entire composition of the pre-cleaning solution. By setting the concentration in such a range, it is possible to ensure that the wettability toward the front side of the intermediate semiconductor device is commensurate with the concentration of the surfactant(s).

In some embodiments, the solvent of the pre-cleaning solution may be deionized water.

In some embodiments, the front side of the intermediate semiconductor device illustrated in FIG. 4 may be covered (or immersed) by the pre-cleaning solution for about 2 minutes. Next, the intermediate semiconductor device may be rinsed using deionized water to remove the pre-cleaning solution.

In some embodiments, a drying process may be performed after the pre-cleaning treatment. The drying process may be performed by spinning between about 100 rpm and about 6000 rpm, or about 3000 rpm, for about 20 seconds and using the air flow to dry the intermediate semiconductor device. In some embodiments, nitrogen or isopropyl alcohol may be used to facilitate the dry process. In some embodiments, the dry process may be optional. That is, the cleaning process may be directly performed after the rinsing of the pre-cleaning solution.

Conventionally, the cleaning process may be performed solely using diluted hydrofluoric acid without any pre-cleaning treatment. The underlying first conductive layer 107 may be damaged to cause profile defects (e.g., undercuts) or electron migration after filling conductive material into the opening OP. In contrast, in the present embodiment, the underlying first conductive layer 107 may be protected by the chelating agent(s) and/or the corrosion inhibitor(s) contained in the pre-cleaning solution. As a result, the profile defects or electron migration may be reduced or avoided. Accordingly, the yield and the reliability of the resulting semiconductor device 1A may be improved.

Figure 7:
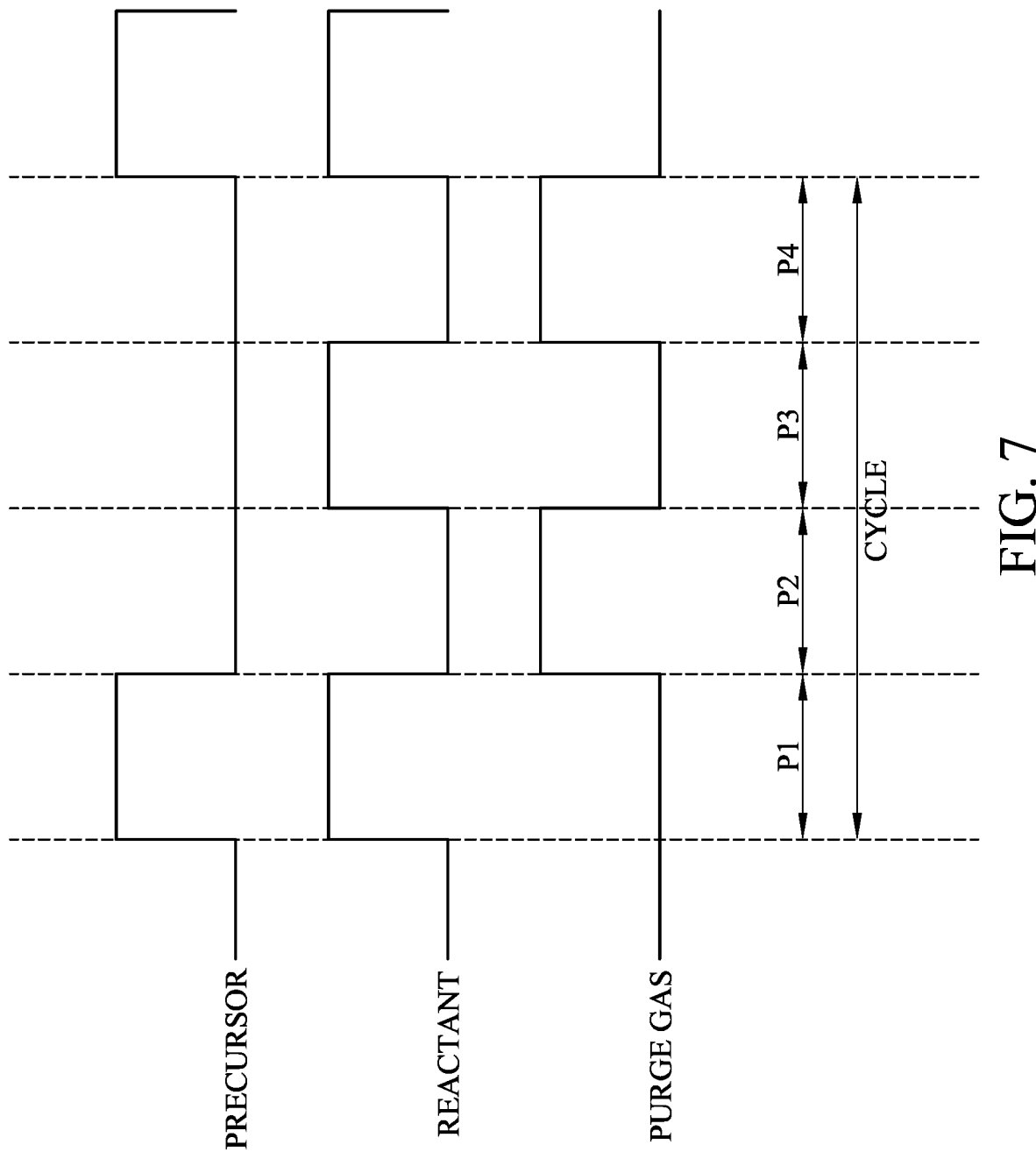
FIGS. 7 and 8 are charts showing examples of process conditions for forming a layer of second barrier material in accordance with some embodiments of the present disclosure.
Figure 8:
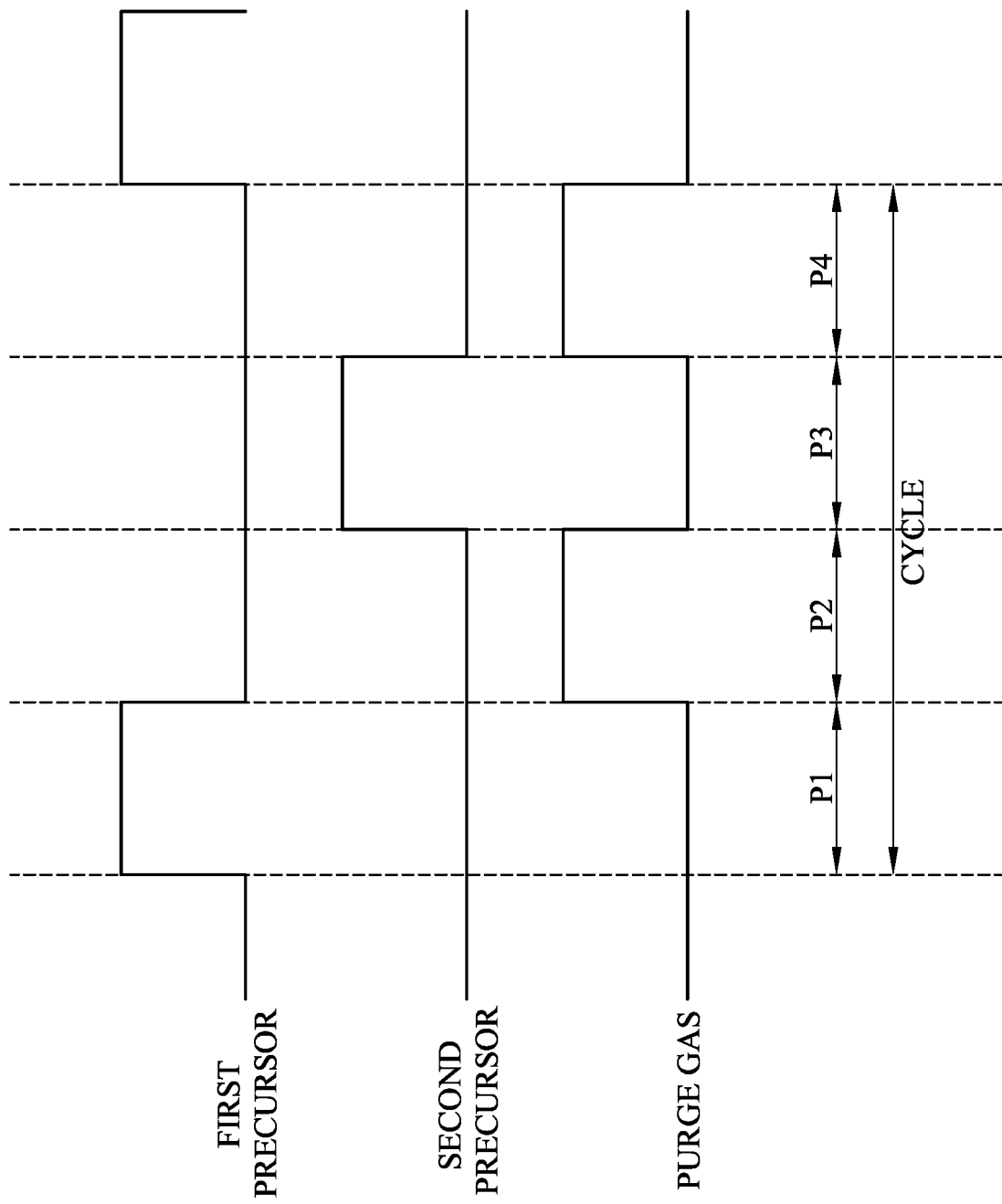

FIGS. 7 and 8 are charts showing examples of process conditions for forming a layer of second barrier material 405 in accordance with some embodiments of the present disclosure.

With reference to FIG. 1 and FIGS. 5 to 8, at step S13, a layer of first barrier material 403 may be conformally formed in the opening OP, and the layer of second barrier material 405 may be conformally formed on the layer of first barrier material 403.

Figure 5:
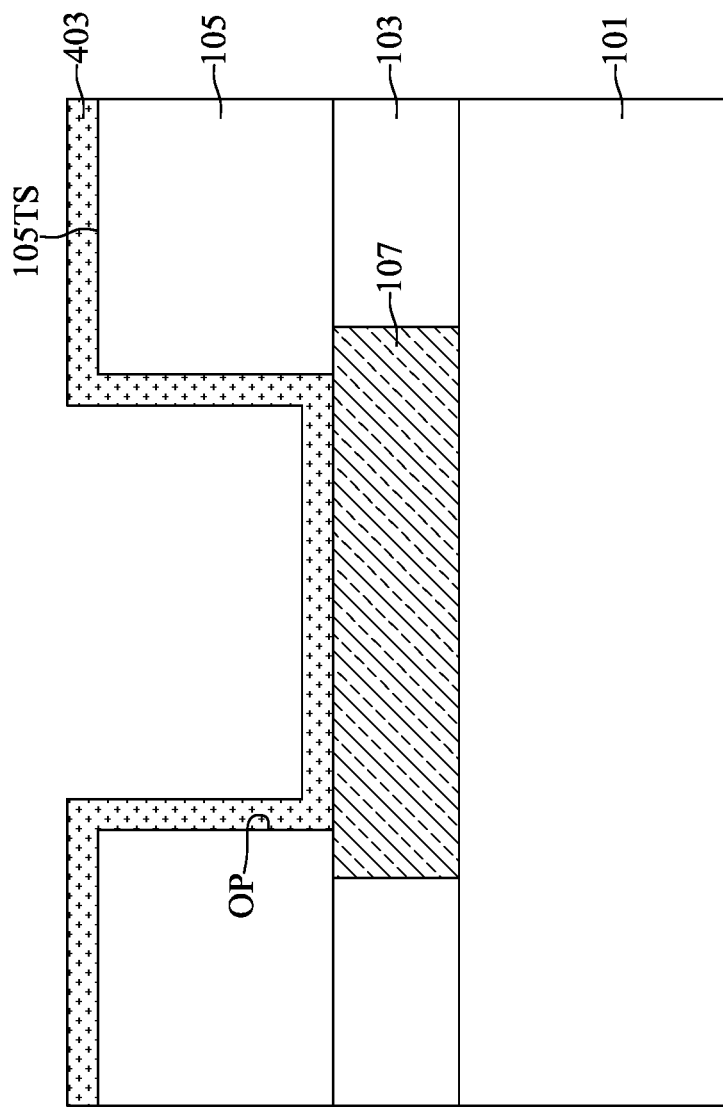

With reference to FIG. 5, the layer of first barrier material 403 may be conformally formed in the opening OP and on the top surface 105TS of the second dielectric layer 105. The first barrier material 403 may be, for example, titanium, tantalum, or a combination thereof. The layer of first barrier material 403 may be formed by, for example, physical vapor deposition, chemical vapor deposition, sputtering, atomic layer deposition, or other applicable deposition process.

Figure 6:
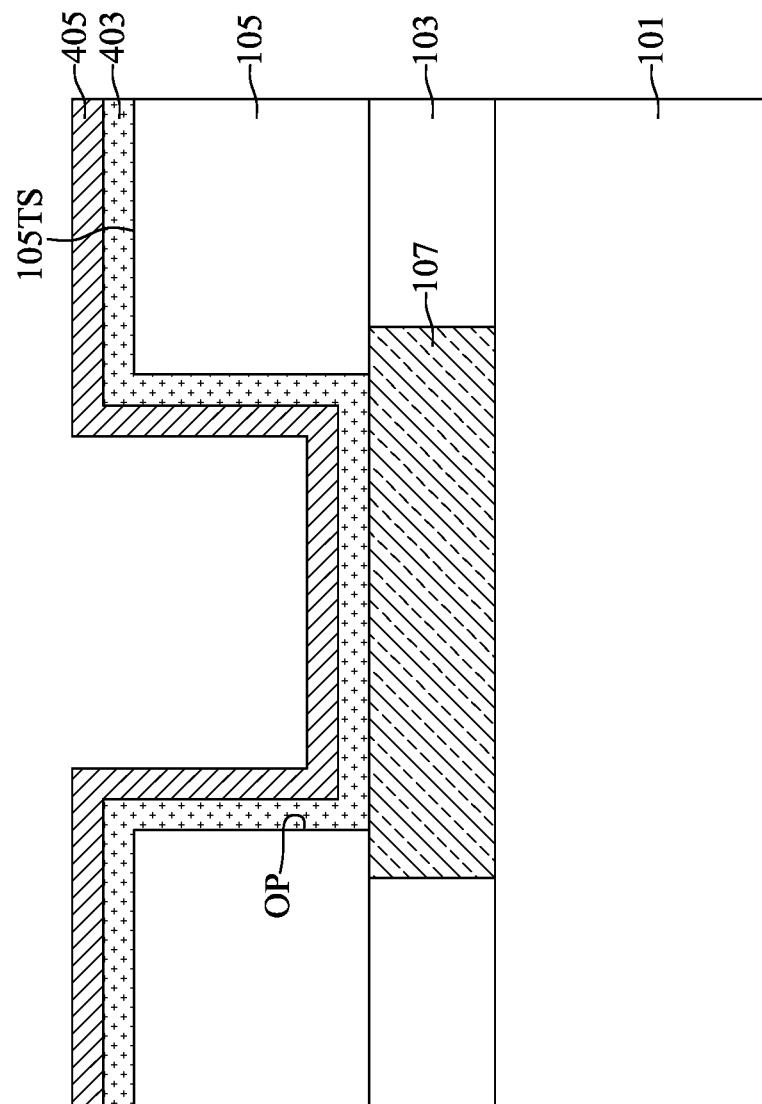

With reference to FIG. 6, the layer of second barrier material 405 may be conformally formed on the layer of first barrier material 403. The second barrier material 405 may be, for example, titanium nitride, tantalum nitride, or a combination thereof. In the present embodiment, the second barrier material 405 is titanium nitride.

With reference to FIGS. 6 and 7, in some embodiments, the layer of second barrier material 405 may be formed by chemical vapor deposition. In some embodiments, the formation of the layer of second barrier material 405 may include a source gas introducing step, a first purging step, a reactant flowing step, and a second purging step. The source gas introducing step, the first purging step, the reactant flowing step, and the second purging step may be referred to as one cycle. Multiple cycles may be performed to obtain the desired thickness of the layer of second barrier material 405.

Detailedly, the intermediate semiconductor device illustrated in FIG. 5 may be loaded in a reaction chamber. In the source gas introducing step, during a period P1, source gases containing a precursor and a reactant may be introduced to the reaction chamber containing the intermediate semiconductor device. The precursor and the reactant may diffuse across the boundary layer and reach the surface of the intermediate semiconductor device (i.e., the surface of the layer of first barrier material 403). The precursor and the reactant may adsorb on and subsequently migrate on the surface aforementioned. The adsorbed precursor and the adsorbed reactant may react on the surface aforementioned and form solid byproducts. The solid byproducts may form nuclei on the surface aforementioned. The nuclei may grow into islands and the islands may merge into a continuous thin film on the surface aforementioned. In the first purging step, during a period P2, a purge gas such as argon may be injected into the reaction chamber to purge out the gaseous byproducts, unreacted precursor, and unreacted reactant.

In the reactant flowing step, during a period P3, the reactant may be solely introduced to the reaction chamber to turn the continuous thin film into the layer of second barrier material 405. In the second purging step, during a period P4, a purge gas such as argon may be injected into the reaction chamber to purge out the gaseous byproducts and unreacted reactant.

In some embodiments, the formation of the layer of second barrier material 405 using chemical vapor deposition may be performed with the assistance of plasma. The source of the plasma may be, for example, argon, hydrogen, or a combination thereof.

For example, the precursor may be titanium tetrachloride. The reactant may be ammonia. Titanium tetrachloride and ammonia may react on the surface and form a titanium nitride film including high chloride contamination due to incomplete reaction between titanium tetrachloride and ammonia. The ammonia in the reactant flowing step may reduce the chloride content of the titanium nitride film. After the ammonia treatment, the titanium nitride film may be referred to as the layer of second barrier material 405.

With reference to FIG. 8, in some other embodiments, the layer of second barrier material 405 may be formed by atomic layer deposition such as photo-assisted atomic layer deposition or liquid injection atomic layer deposition. In some embodiments, the formation of the layer of second barrier material 405 may include a first precursor introducing step, a first purging step, a second precursor introducing step, and a second purging step. The first precursor introducing step, the first purging step, the second precursor introducing step, and the second purging step may be referred to as one cycle. Multiple cycles may be performed to obtain the desired thickness of the layer of second barrier material 405.

Detailedly, the intermediate semiconductor device illustrated in FIG. 5 may be loaded in the reaction chamber. In the first precursor introducing step, during a period P5, a first precursor may be introduced to the reaction chamber. The first precursor may diffuse across the boundary layer and reach the surface of the intermediate semiconductor device (i.e., the surface of the layer of first barrier material 403). The first precursor may adsorb on the surface aforementioned to form a monolayer at a single atomic layer level. In the first purging step, during a period P6, a purge gas such as argon may be injected into the reaction chamber to purge out unreacted first precursor.

In the second precursor introducing step, during a period P7, a second precursor may be introduced to the reaction chamber. The second precursor may react with the monolayer and turn the monolayer into the layer of second barrier material 405. In the second purging step, during a period P8, a purge gas such as argon may be injected into the reaction chamber to purge out unreacted second precursor and gaseous byproduct. Compared to the chemical vapor deposition, a particle generation caused by a gas phase reaction may be suppressed because the first precursor and the second are separately introduced.

For example, the first precursor may be titanium tetrachloride. The second precursor may be ammonia. Adsorbed titanium tetrachloride may form a titanium nitride monolayer. The ammonia in the second precursor introducing step may react with the titanium nitride monolayer and turn the titanium nitride monolayer into the layer of second barrier material 405.

In some embodiments, the formation of the layer of second barrier material 405 using atomic layer deposition may be performed with the assistance of plasma. The source of the plasma may be, for example, argon, hydrogen, oxygen, or a combination thereof. In some embodiments, the oxygen source may be, for example, water, oxygen gas, or ozone. In some embodiments, co-reactants may be introduced to the reaction chamber. The co-reactants may be selected from the group consisting of hydrogen, hydrogen plasma, oxygen, air, water, ammonia, hydrazines, alkylhydrazines, boranes, silanes, ozone and a combination thereof.

In some embodiments, the formation of the layer of second barrier material 405 may be performed using the following process conditions. The substrate temperature may be between about 160° C. and about 300° C. The evaporator temperature may be about 175° C. The pressure of the reaction chamber may be about 5 mbar. The solvent for the first precursor and the second precursor may be toluene.

Figure 9:
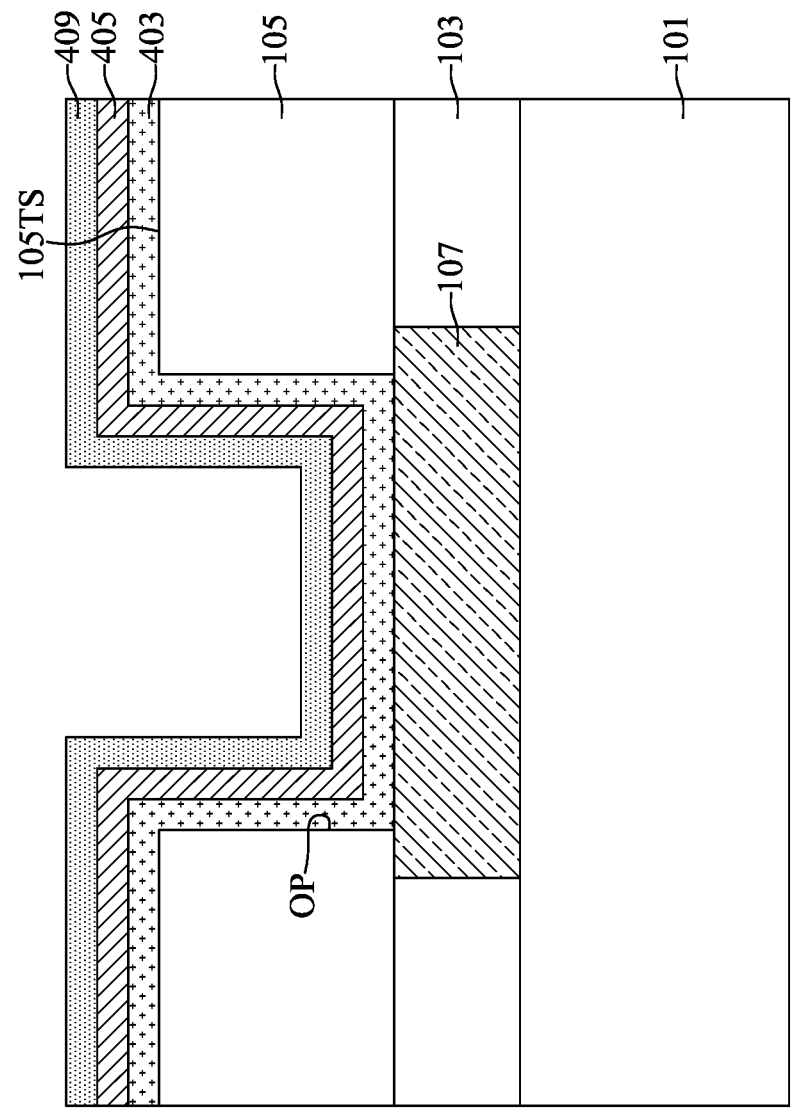
FIG. 9 illustrates, in a schematic cross-sectional view diagram, part of the flow for fabricating the semiconductor device in accordance with one embodiment of the present disclosure.
Figure 10:
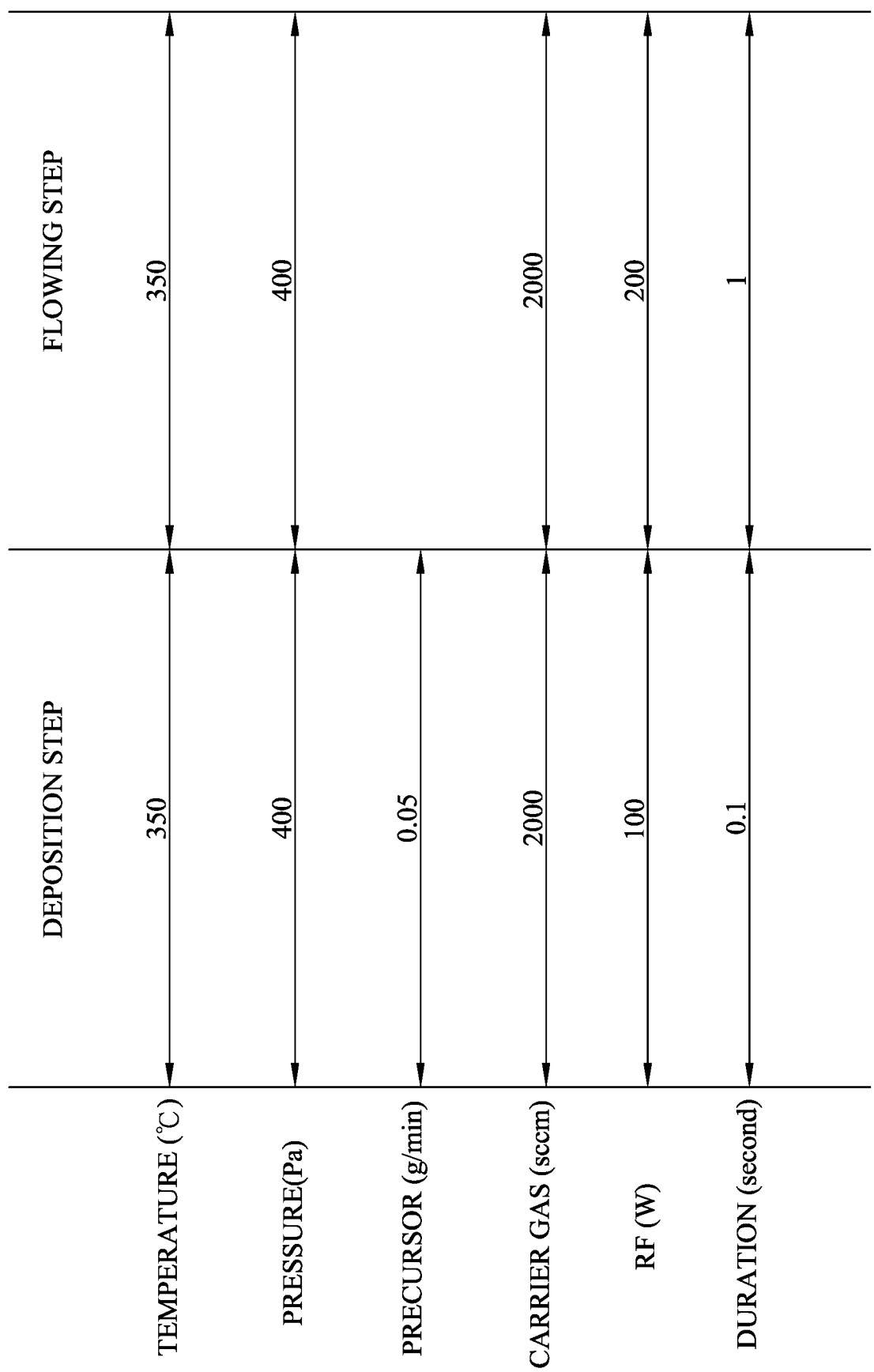
FIG. 10 is a chart showing an example of process conditions for forming a layer of first material in accordance with one embodiment of the present disclosure.
Figure 11:
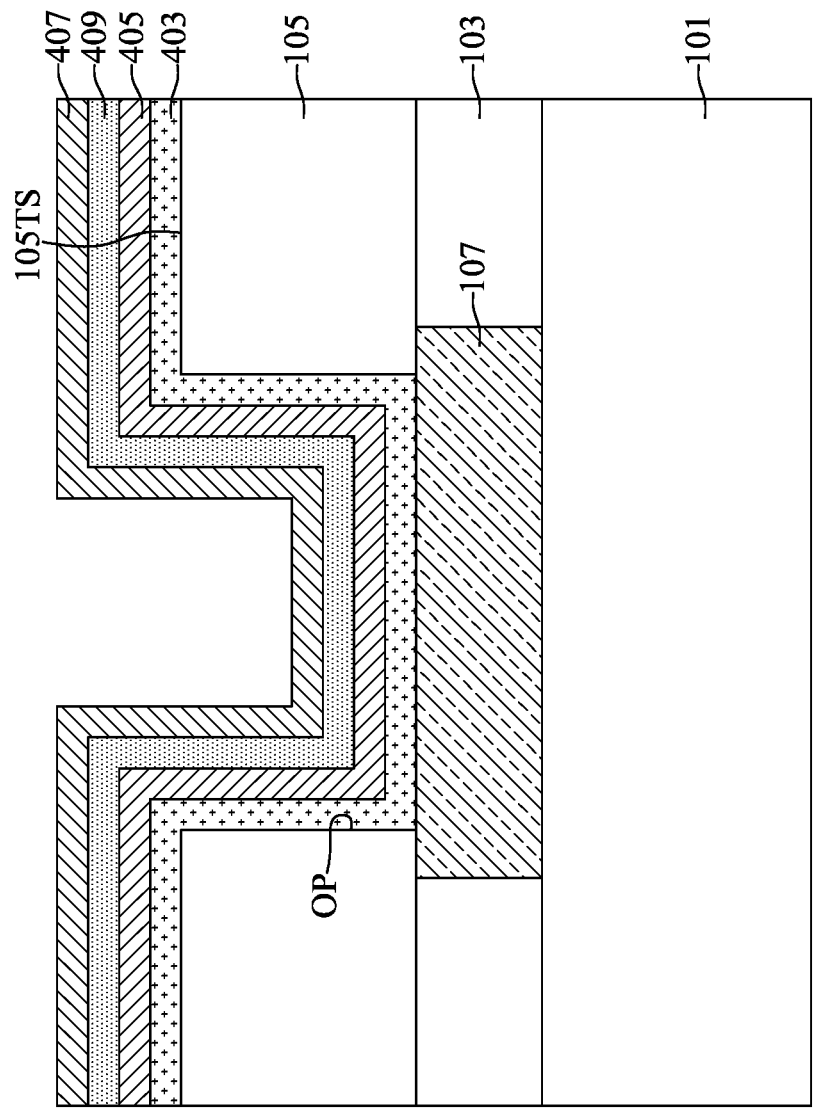
FIGS. 11 to 13 illustrate, in schematic cross-sectional view diagrams, part of the flow for fabricating the semiconductor device in accordance with one embodiment of the present disclosure.
Figure 12:
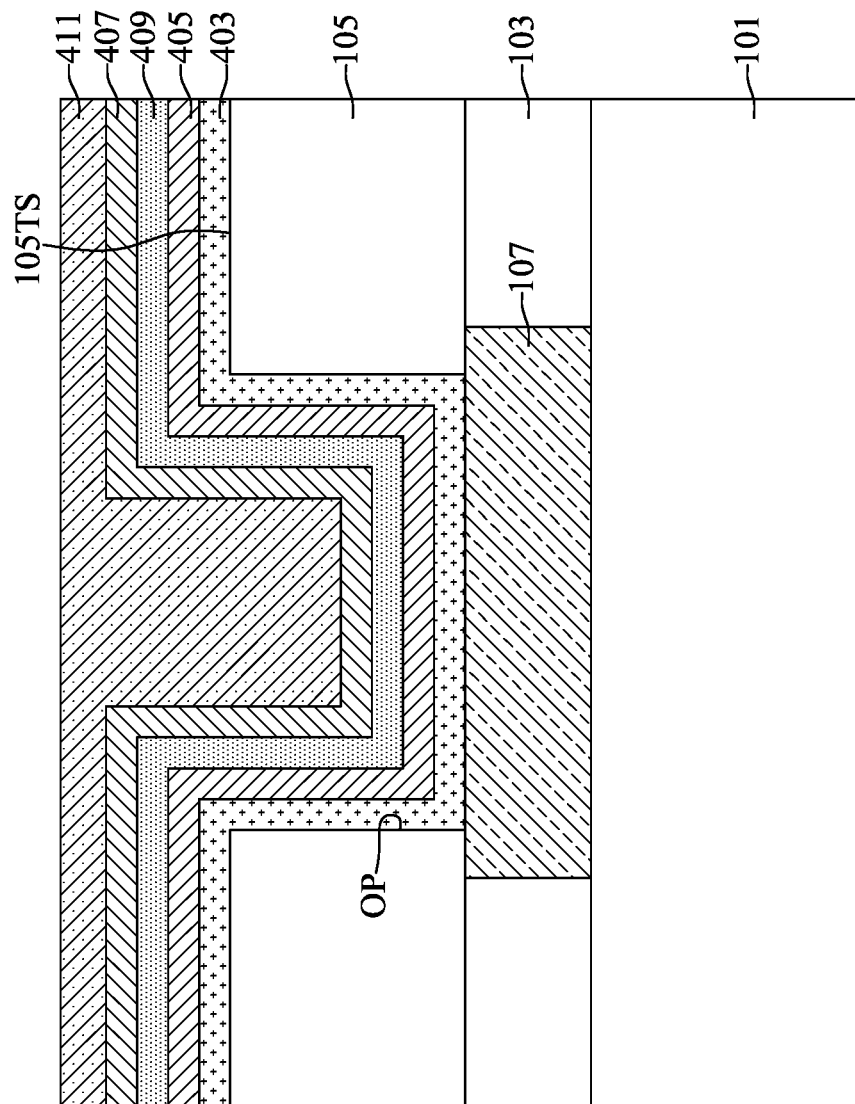
Figure 13:
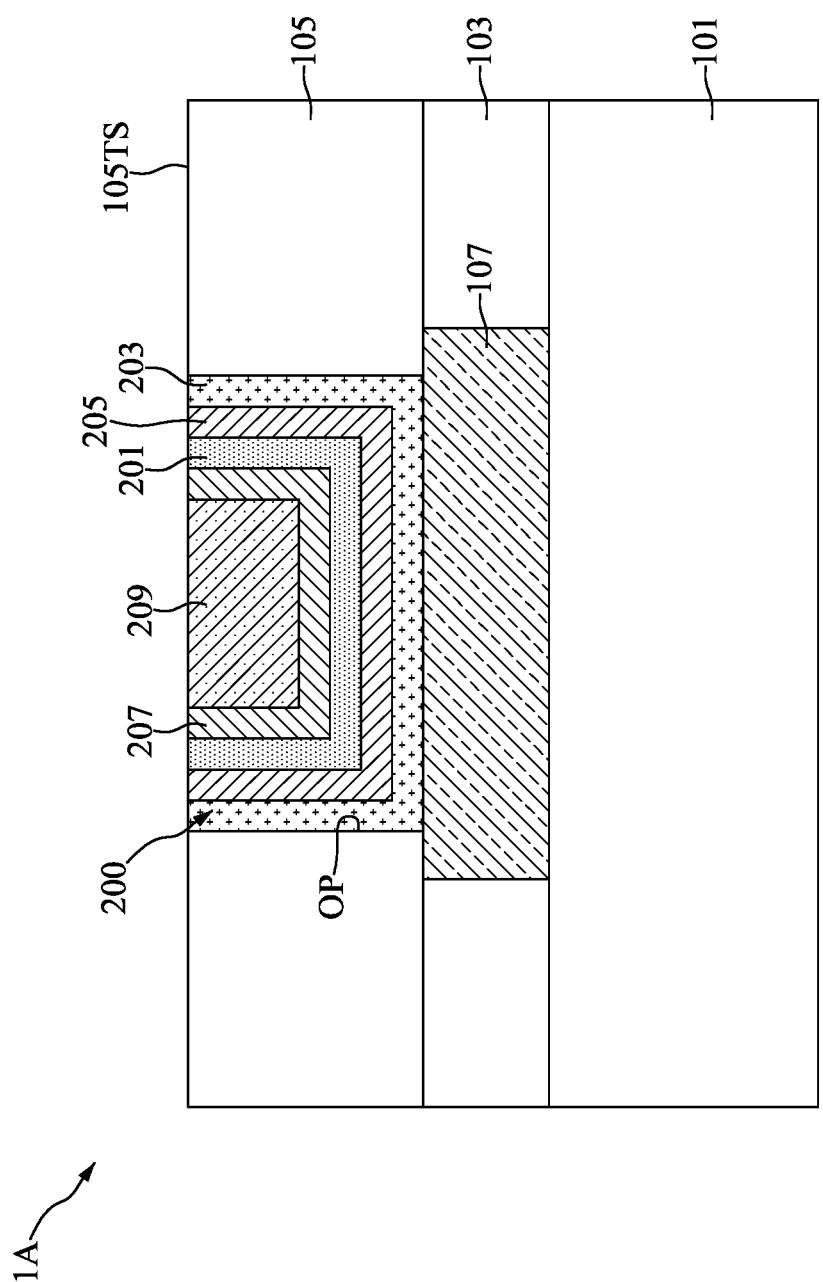

FIG. 9 illustrates, in a schematic cross-sectional view diagram, part of the flow for fabricating the semiconductor device 1A in accordance with one embodiment of the present disclosure. FIG. 10 is a chart showing an example of process conditions for forming a layer of first material 409 in accordance with one embodiment of the present disclosure. FIGS. 11 to 13 illustrate, in schematic cross-sectional view diagrams, part of the flow for fabricating the semiconductor device 1A in accordance with one embodiment of the present disclosure.

With reference to FIG. 1 and FIGS. 9 to 12, at step S15, the layer of first material 409 may be conformally formed on the layer of second barrier material 405, a layer of third barrier material 407 may be conformally formed on the layer of first material 409, and a layer of filler material 411 may be formed on the layer of third barrier material 407.

With reference to FIGS. 9 and 10, the layer of first material 409 may be conformally formed on the layer of second barrier material 405. The first material 409 may be, for example, silicon carbide. The layer of first material 409 may be formed by, for example, a plasma-enhanced chemical vapor deposition process. The formation of the layer of first material 409 may include a deposition step and a flowing step. The deposition step and the flowing step may be referred to as one cycle. Multiple cycles may be performed to obtain the desired thickness of the layer of first material 409. For example, the number of cycle of forming the layer of first material 409 may be between about 20 and 120, between about 40 and 100, or between about 50 and 90.

During the deposition step, the precursor may be supplied with the carrier gas. The carrier gas may be an inert gas such as argon or helium. In some embodiments, the carrier gas may be continuously supplied. The plasma for the deposition may be generated in situ, for example, in an atmosphere of inert gas that flows continuously throughout the deposition step. For another example, the plasma may be generated remotely and provided to the reaction chamber contained the intermediate semiconductor device. In some embodiments, the precursor may be, for example, monoacetylsilane, monovinylsilane, or phenylsilane. In some embodiments, the flow rate of the precursor of the deposition step may be between about 0.001 g/min and about 0.1 g/min. In some embodiments, the flow rate of the carrier gas of the deposition step may be between about 100 sccm and about 4000 sccm. In some embodiments, the duration of the deposition step may be between about 0.1 seconds and about 3 seconds. In some embodiments, the process temperature of the deposition step may be between about 50° C. and about 400° C. In some embodiments, the process pressure of the deposition step may be between about 200 Pa and about 2000 Pa. In some embodiments, the radio frequency (RF) power of the deposition step may be between 50 W and about 500 W.

It should be noted that, in the description of the present disclosure, the term "precursor" refers generally to a compound that participates in the chemical reaction that produces another compound, and particularly to a compound that constitutes a film matrix (or a layer matrix) or a main skeleton of a film (or a layer). The term "inert gas" refers to a gas that excites a precursor when RF power is applied. The inert gas does not become a part of a film matrix (or a layer matrix).

During the flowing step, the precursor may be stopped, and the carrier gas such as noble gases and nitrogen gas may be solely supplied. In some embodiments, the flow rate of the carrier gas of the flowing step may be between about 100 sccm and about 4000 sccm. In some embodiments, the duration of the flowing step may be between about 0.1 seconds and about 10 seconds. In some embodiments, the process temperature of the flowing step may be between about 50° C. and about 400° C. In some embodiments, the process pressure of the flowing step may be between about 200 Pa and about 2000 Pa. In some embodiments, the RF power of the flowing step may be between 100 W and about 1000 W.

With reference to FIG. 11, the layer of third barrier material 407 may be conformally formed on the layer of first material 409. The third barrier material 407 may be, for example, titanium nitride, tantalum nitride, or a combination thereof. The layer of third barrier material 407 may be formed with a procedure similar to that illustrated in FIGS. 6 to 8, and descriptions thereof are not repeated herein.

With reference to FIG. 12, the layer of filler material 411 may be formed on the layer of third barrier material 407 and completely fill the opening OP. The filler material 411 may be, for example, copper or tungsten. The layer of filler material 411 may be formed by, for example, physical vapor deposition, sputtering, chemical vapor deposition, or other applicable deposition process.

With reference to FIGS. 1 and 13, at step S17, a planarization process may be performed to form a liner structure 200 and a filler layer 209 in the opening OP.

With reference to FIG. 13, the planarization process, such as chemical mechanical polishing, may be performed until the top surface 105TS of the second dielectric layer 105 is exposed to remove excess material and provide a substantially flat surface for subsequent processing steps. After the planarization process, the layer of first barrier material 403 may be turned into a first barrier film 203 having a U-shaped cross-sectional profile. The layer of second barrier material 405 may be turned into a second barrier film 205 having a U-shaped cross-sectional profile. The layer of first material 409 may be turned into an intervening film 201 having a U-shaped cross-sectional profile. The layer of third barrier material 407 may be turned into a third barrier film 207 having a U-shaped cross-sectional profile. The intervening film 201, the first barrier film 203, the second barrier film 205, and the third barrier film 207 together configure the liner structure 200 formed on the first conductive layer 107. The layer of filler material 411 may be turned into a filler layer 209. The top surfaces of the intervening film 201, the first barrier film 203, the second barrier film 205, the third barrier film 207, and the filler layer 209 may be substantially coplanar due to the planarization process.

By employing the intervening film 201 formed of silicon carbide, the electron migration during depositing the third barrier material 407 and/or the filler material 411 may be reduced or avoided. As a result, the yield and/or reliability of the resulting semiconductor device 1A may be improved.

Figure 14:
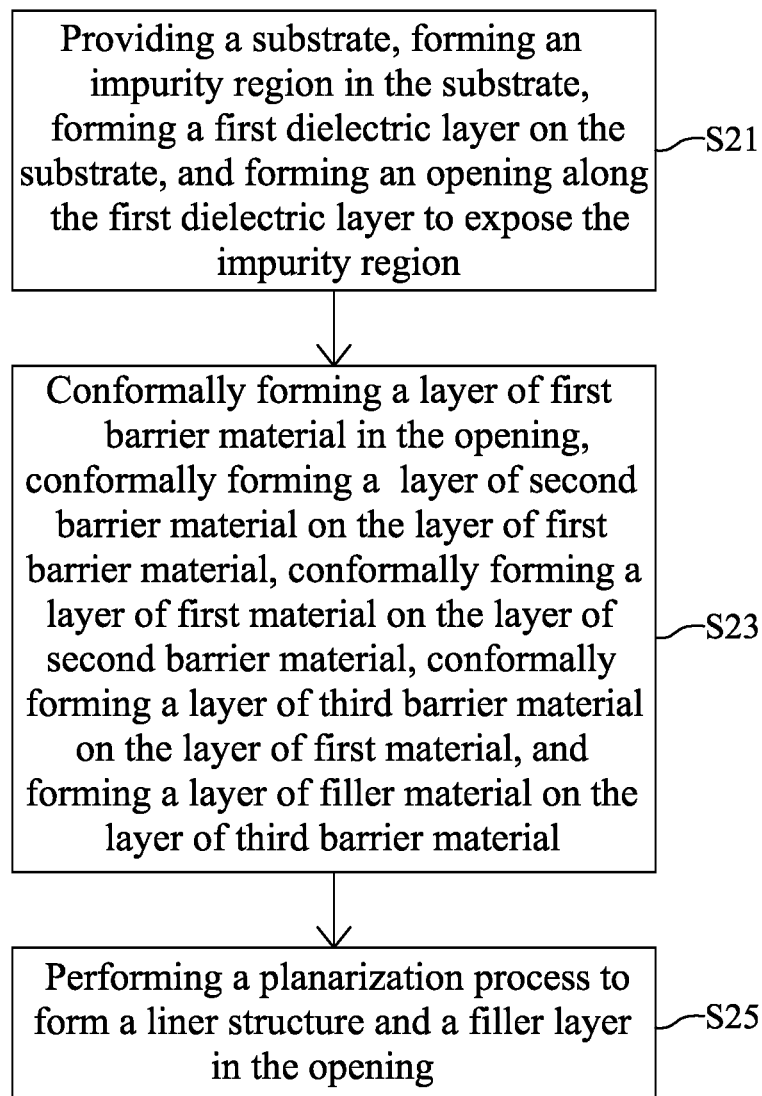
FIG. 14 illustrates, in a flowchart diagram form, a method 20 for fabricating a semiconductor device in accordance with another embodiment of the present disclosure.

FIG. 14 illustrates, in a flowchart diagram form, a method 20 for fabricating a semiconductor device 1B in accordance with another embodiment of the present disclosure. FIGS. 15 to 18 illustrate, in schematic cross-sectional view diagrams, a flow for fabricating the semiconductor device 1B in accordance with another embodiment of the present disclosure.

Figure 15:
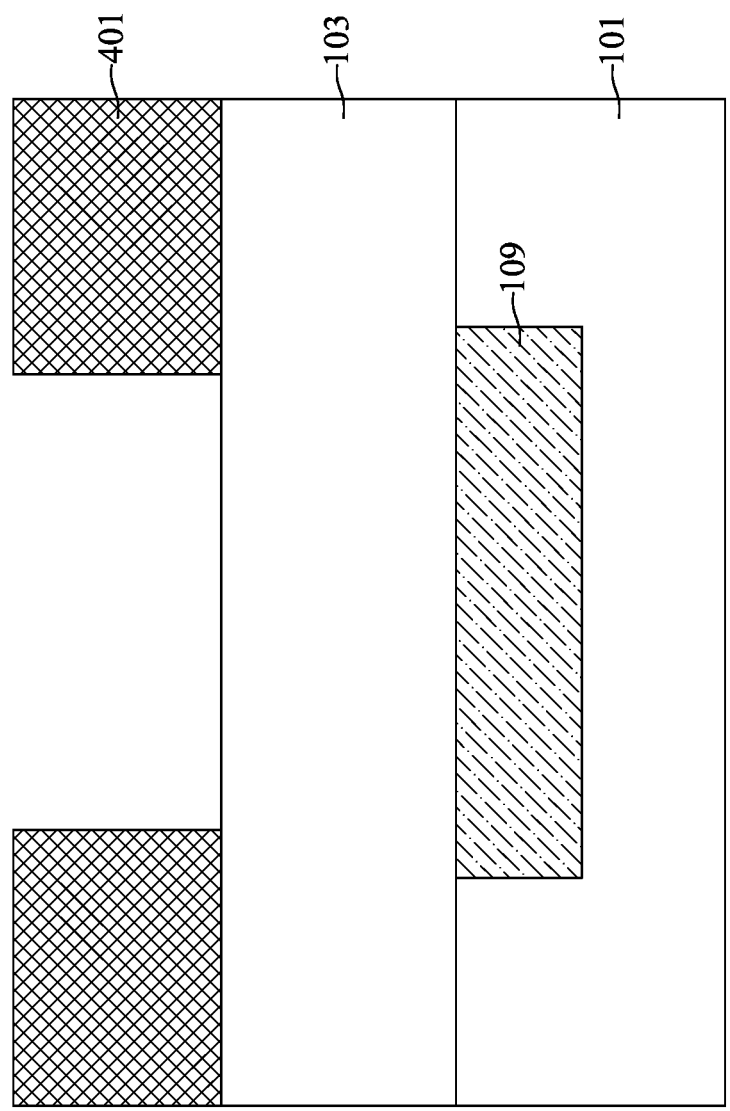
FIGS. 15 to 18 illustrate, in schematic cross-sectional view diagrams, a flow for fabricating the semiconductor device in accordance with another embodiment of the present disclosure.
Figure 16:
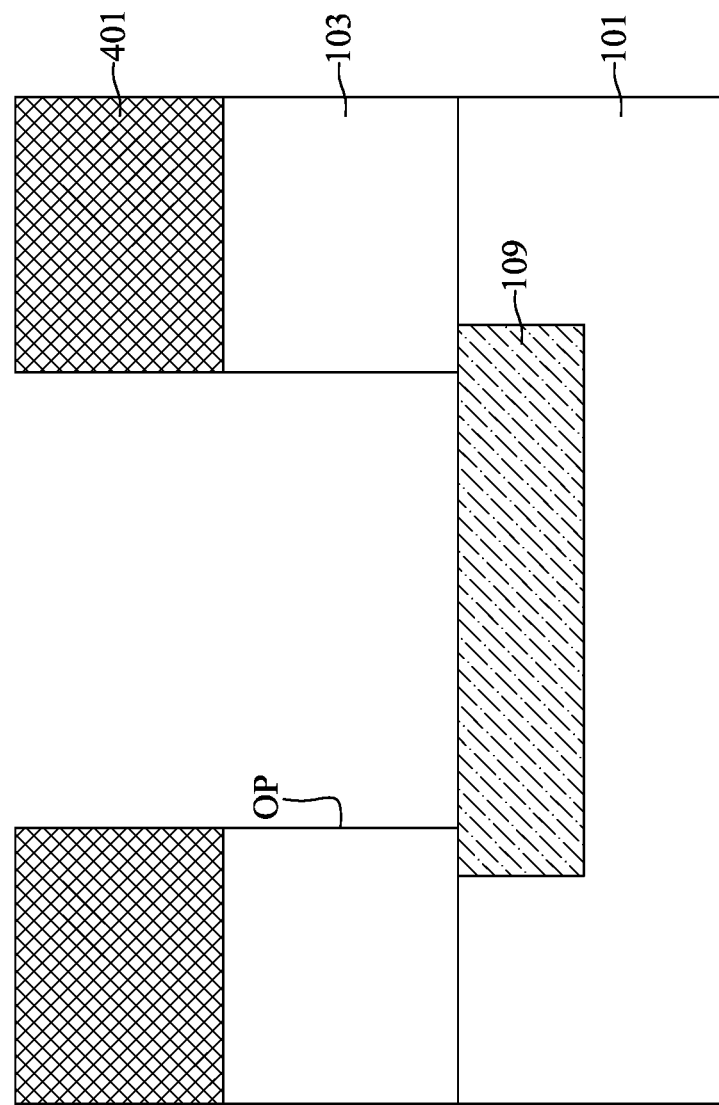

With reference to FIGS. 14 to 16, at step S21, a substrate 101 may be provided, an impurity region 109 may be formed in the substrate 101, a first dielectric layer 103 may be formed on the substrate 101, and an opening OP may be formed along the first dielectric layer 103 to expose the impurity region 109.

With reference to FIG. 15, the substrate 101 may include bulk silicon, or another suitable semiconductor material. In some embodiments, the substrate 101 may include a silicon-containing material. Illustrative examples of silicon-containing materials suitable for the substrate 101 may include, but are not limited to, silicon, silicon germanium, carbon doped silicon germanium, silicon germanium carbide, carbon-doped silicon, silicon carbide, and multi-layers thereof.

With reference to FIG. 15, a portion of the substrate 101 may be doped with impurities to form the impurity region 109. The impurity region 109 may have a conductivity type such as p-type or n-type. The "p-type" refers to the addition of impurities to an intrinsic semiconductor that creates deficiencies of valence electrons. In a silicon-containing material, examples of p-type dopants, i.e., impurities include but are not limited to boron, aluminum, gallium, and indium. The "n-type" refers to the addition of impurities that contribute free electrons to an intrinsic semiconductor. In a silicon-containing material, examples of n-type dopants, i.e., impurities, include but are not limited to antimony, arsenic, and phosphorus. In some embodiments, the dopant concentration of the impurity region 109 may be between about 1E19 atoms/cm^3 and about 1E21 atoms/cm^3.

Alternatively, in some embodiments, the impurity region 109 may be formed by removing the portion of the substrate 101 and subsequently performing an epitaxial growth process. The epitaxial growth process may be, for example, rapid thermal chemical vapor deposition, low-energy plasma deposition, ultra-high vacuum chemical vapor deposition, atmospheric pressure chemical vapor deposition, or molecular beam epitaxy. In some embodiments, the epitaxial material for a n-type device may include Si, SiC, SiCP, SiGeP, SiP, SiGeSnP, or the like, and the epitaxial material for a p-type device may include SiGe, SiGeB, Ge, GeB, GeSn, GeSnB, a boron-doped III-V compound material, or the like. In some embodiments, dopants may be incorporated in-situ using appropriate precursors. It should be noted that the term "in-situ" means that the dopant that dictates the conductivity type of a doped layer is introduced during the process step, for example epitaxial deposition, that forms the doped layer.

With reference to FIG. 15, the first dielectric layer 103 may be formed on the substrate 101 with a procedure similar to that illustrated in FIG. 2, and descriptions thereof are not repeated herein.

With reference to FIG. 15, a first mask layer 401 may be formed on the first dielectric layer 103. The first mask layer 401 may be a photoresist layer and may include the pattern of the opening OP.

With reference to FIG. 16, an etching process may be performed using the first mask layer 401 as the mask to remove portions of the first dielectric layer 103. In some embodiments, the etch rate ratio of the first dielectric layer 103 to the first mask layer 401 may be between about 100:1 and about 1.05:1 or between about 100:1 and about 10:1 during the etching process. The etch rate ratio of the first dielectric layer 103 to the impurity region 109 may be between about 100:1 and about 1.05:1 or between about 100:1 and about 10:1 during the etching process. After the etching process, the opening OP may be formed along the first dielectric layer 103 to expose the impurity region 109.

With reference to FIG. 16, after the formation of the opening OP, the first mask layer 401 may be removed by, for example, an ashing process. The pre-cleaning process and the cleaning process for the etching residues may be performed, and descriptions thereof are not repeated herein.

Figure 17:
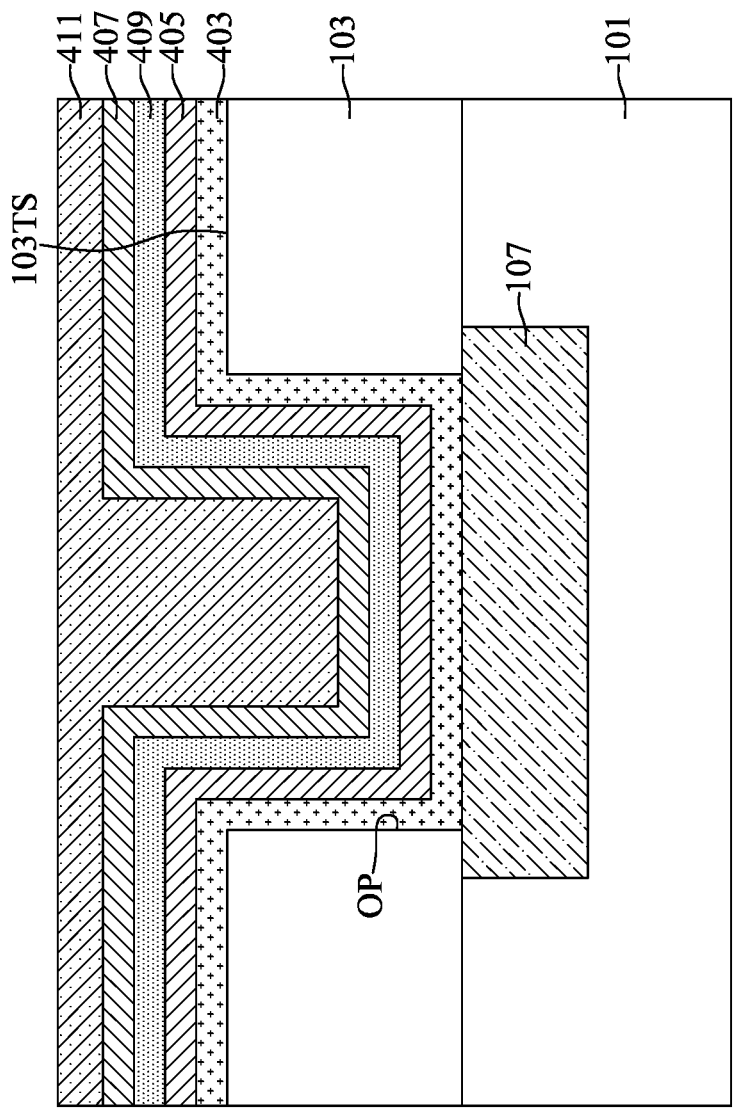

With reference to FIGS. 14 and 17, at step S23, a layer of first barrier material 403 may be conformally formed in the opening OP, a layer of second barrier material 405 may be conformally formed on the layer of first barrier material 403, a layer of first material 409 may be conformally formed on the layer of second barrier material 405, a layer of third barrier material 407 may be conformally formed on the layer of first material 409, and a layer of filler material 411 may be formed on the layer of third barrier material 407.

With reference to FIG. 17, the layer of first barrier material 403 may be conformally formed in the opening OP and on the top surface 103TS of the first dielectric layer 103. The layer of first barrier material 403 may be formed with a procedure similar to that illustrated in FIG. 5, and descriptions thereof are not repeated herein. The layer of second barrier material 405, the layer of first material 409, the layer of third barrier material 407, and the layer of filler material 411 may be formed with a procedure similar to that illustrated in FIGS. 6 to 12, and descriptions thereof are not repeated herein.

Figure 18:
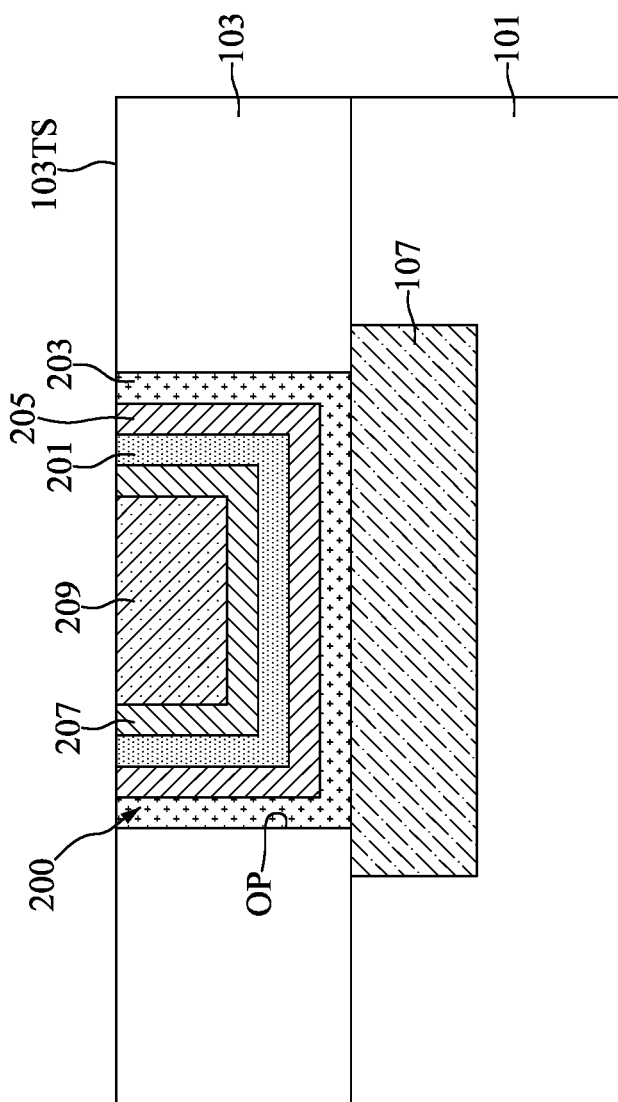

With reference to FIGS. 14 and 18, at step S25, a planarization process may be performed to form a liner structure 200 and a filler layer 209 in the opening OP.

With reference to FIG. 18, the planarization process, such as chemical mechanical polishing, may be performed until the top surface 103TS of the first dielectric layer 103 is exposed to remove excess material and provide a substantially flat surface for subsequent processing steps. After the planarization process, the layer of first barrier material 403 may be turned into a first barrier film 203 having a U-shaped cross-sectional profile. The layer of second barrier material 405 may be turned into a second barrier film 205 having a U-shaped cross-sectional profile. The layer of first material 409 may be turned into an intervening film 201 having a U-shaped cross-sectional profile. The layer of third barrier material 407 may be turned into a third barrier film 207 having a U-shaped cross-sectional profile. The intervening film 201, the first barrier film 203, the second barrier film 205, and the third barrier film 207 together configure the liner structure 200 formed on the impurity region 109. The layer of filler material 411 may be turned into a filler layer 209. The top surfaces of the intervening film 201, the first barrier film 203, the second barrier film 205, the third barrier film 207, and the filler layer 209 may be substantially coplanar due to the planarization process.

By employing the intervening film 201 formed of silicon carbide, the electron migration during depositing the third barrier material 407 and/or the filler material 411 may be reduced or avoided. As a result, the yield and/or reliability of the resulting semiconductor device 1B may be improved.

One aspect of the present disclosure provides a semiconductor device including a substrate; a first dielectric layer positioned on the substrate; a first conductive layer positioned in the first dielectric layer; an intervening film positioned on the first conductive layer and including a U-shaped cross-sectional profile; and a filler layer positioned on the intervening film. The intervening film includes silicon carbide.

Another aspect of the present disclosure provides a semiconductor device including a substrate; an impurity region positioned in the substrate; an intervening film positioned on the impurity region and including a U-shaped cross-sectional profile; and a filler layer positioned on the intervening film. The intervening film includes silicon carbide.

Another aspect of the present disclosure provides a method for fabricating a semiconductor device including providing a substrate; forming a first dielectric layer on the substrate; forming a first conductive layer in the first dielectric layer; forming a second dielectric layer on the first dielectric layer; forming an opening along the second dielectric layer to expose the first conductive layer; conformally forming a layer of first material in the opening; forming a layer of filler material on the layer of first material to completely fill the opening; performing a planarization process until the top surface of the second dielectric layer is exposed to turn the layer of first material into an intervening film and the layer of filler material into a filler layer. The intervening film includes a U-shaped cross-sectional profile and silicon carbide.

Another aspect of the present disclosure provides a method for fabricating a semiconductor device including providing a substrate; forming an impurity region in the substrate; forming a first dielectric layer on the substrate; forming an opening along the first dielectric layer to expose the impurity region; conformally forming a layer of first material in the opening; forming a layer of filler material on the layer of first material to completely fill the opening; performing a planarization process until the top surface of the first dielectric layer is exposed to turn the layer of first material into an intervening film and the layer of filler material into a filler layer. The intervening film includes a U-shaped cross-sectional profile and silicon carbide.

Due to the design of the semiconductor device of the present disclosure, the electron migration may be reduced or avoided by employing the intervening film 201 formed of silicon carbide. As a result, the yield and/or reliability of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a first dielectric layer positioned on a top surface of the substrate;
a first conductive layer positioned in the first dielectric layer;
a second dielectric layer formed on a top surface of the first dielectric layer, wherein the second dielectric layer has an opening formed therethrough to expose a top surface of the first conductive layer, such that a height of the opening is equal to a height of the second dielectric layer;
an intervening film positioned on the first conductive layer and comprising a U-shaped cross-sectional profile, wherein the intervening film is formed above the first dielectric layer and within the opening of the second dielectric layer at a position that a top surface of the intervening film is coplanar with a top surface of the second dielectric layer; and a filler layer positioned on the intervening film, above the first dielectric layer, and within the opening of the second dielectric layer at a position that a top surface of the filler layer is coplanar with the top surface of the second dielectric layer;

wherein the intervening film comprises silicon carbide.

2. The semiconductor device of claim 1, further comprising a first barrier film positioned between the first conductive layer and the intervening film;

wherein the first barrier film, having a U-shaped cross-sectional profile, is disposed above the first dielectric layer and within the opening of the second dielectric layer at a position that a top surface of the first barrier film is coplanar with the top surface of the second dielectric layer;

wherein the first barrier film comprises titanium, tantalum, or a combination thereof;

wherein a width of the opening of the second dielectric layer is smaller than a width of the first conductive layer.

3. The semiconductor device of claim 2, further comprising a second barrier film positioned between the first barrier film and the intervening film;

wherein the second barrier film, having a U-shaped cross-sectional profile, is disposed above the first dielectric layer and within the opening of the second dielectric layer at a position that a top surface of the second barrier film is coplanar with the top surface of the second dielectric layer;

wherein the second barrier film comprises titanium nitride, tantalum nitride, or a combination thereof.

4. The semiconductor device of claim 3, further comprising a third barrier film positioned between the intervening film and the filler layer;

wherein the third barrier film, having a U-shaped cross-sectional profile, is disposed above the first dielectric layer and within the opening of the second dielectric layer at a position that a top surface of the third barrier film is coplanar with the top surface of the second dielectric layer;

wherein the third barrier film comprises titanium nitride, tantalum nitride, or a combination thereof;

wherein the intervening film, the first barrier film, the second barrier film, and the third barrier film configure a liner structure positioned on the first conductive layer.

5. The semiconductor device of claim 4, wherein the filler layer comprises copper, tungsten, or a combination thereof.

6. The semiconductor device of claim 5, wherein the first conductive layer comprises tungsten, cobalt, zirconium, tantalum, titanium, aluminum, ruthenium, copper, metal carbides, metal nitrides, transition metal aluminides, or a combination thereof;

wherein a height of the first conductive layer is equal to a height of the first dielectric layer, such that the top surface of the first conductive layer is coplanar with the top surface of the first dielectric layer.

7. The semiconductor device of claim 6, wherein the first dielectric layer comprises silicon dioxide, undoped silicate glass, fluorosilicate glass, borophosphosilicate glass, a spin-on low-k dielectric layer, a chemical vapor deposition low-k dielectric layer, or a combination thereof.

8. A semiconductor device, comprising:
a substrate;
an impurity region as a portion of the substrate, wherein the impurity region is formed from a top surface of the substrate, such that a top surface of the impurity region is coplanar with the top surface of the substrate;

a first dielectric layer formed on the top surface of the substrate, wherein the first dielectric layer has an opening formed therethrough to expose the top surface of the impurity region, such that a height of the opening is equal to a height of the first dielectric layer;

an intervening film positioned on the impurity region and comprising a U-shaped cross-sectional profile, wherein the intervening film is formed above the impurity region and within the opening of the first dielectric layer at a position that a top surface of the intervening film is coplanar with a top surface of the first dielectric layer; and a filler layer positioned on the intervening film, above the impurity region, and within the opening of the first dielectric layer at a position that a top surface of the filler layer is coplanar with the top surface of the first dielectric layer;

wherein the intervening film comprises silicon carbide.

9. The semiconductor device of claim 8, further comprising a first barrier film positioned between the impurity region and the intervening film;

wherein the first barrier film is in contact with the impurity region;

wherein the first barrier film, having a U-shaped cross-sectional profile, is disposed above the impurity region and within the opening of the first dielectric layer at a position that a top surface of the first barrier film is coplanar with the top surface of the first dielectric layer;

wherein the first barrier film comprises titanium, tantalum, or a combination thereof;

wherein a width of the opening of the first dielectric layer is smaller than a width of the impurity region.

10. The semiconductor device of claim 9, further comprising a second barrier film positioned between the first barrier film and the intervening film;

wherein the second barrier film, having a U-shaped cross-sectional profile, is disposed above the impurity region and within the opening of the first dielectric layer at a position that a top surface of the second barrier film is coplanar with the top surface of the first dielectric layer;

wherein the second barrier film comprises titanium nitride, tantalum nitride, or a combination thereof.

11. The semiconductor device of claim 10, further comprising a third barrier film positioned between the intervening film and the filler layer;

wherein the third barrier film, having a U-shaped cross-sectional profile, is disposed above the impurity region and within the opening of the first dielectric layer at a position that a top surface of the third barrier film is coplanar with the top surface of the first dielectric layer;

wherein the third barrier film comprises titanium nitride, tantalum nitride, or a combination thereof;

wherein the intervening film, the first barrier film, the second barrier film, and the third barrier film configure a liner structure positioned on the impurity region.

12. The semiconductor device of claim 11, wherein the filler layer comprises copper, tungsten, or a combination thereof.

13. The semiconductor device of claim 12, wherein the impurity region comprises n-type dopants or p-type dopants.

14. The semiconductor device of claim 12, wherein the impurity region comprises epitaxial material.

15. The semiconductor device of claim 13, wherein the first dielectric layer comprises silicon dioxide, undoped silicate glass, fluorosilicate glass, borophosphosilicate glass, a spin-on low-k dielectric layer, a chemical vapor deposition low-k dielectric layer, or a combination thereof.

* * * * *